(12) United States Patent
Hashiguchi et al.

(10) Patent No.: US 11,888,219 B2
(45) Date of Patent: Jan. 30, 2024

(54) ANTENNA AND ASSEMBLY

(71) Applicant: JAPAN AVIATION ELECTRONICS INDUSTRY, LIMITED, Tokyo (JP)

(72) Inventors: Osamu Hashiguchi, Tokyo (JP); Jun Uchida, Tokyo (JP)

(73) Assignee: JAPAN AVIATION ELECTRONICS INDUSTRY, LIMITED, Tokyo (JP)

( * ) Notice: Subject to any disclaimer, the term of this patent is extended or adjusted under 35 U.S.C. 154(b) by 222 days.

(21) Appl. No.: 17/473,482

(22) Filed: Sep. 13, 2021

(65) Prior Publication Data

US 2022/0131261 A1  Apr. 28, 2022

(30) Foreign Application Priority Data

Oct. 28, 2020  (JP) ................. 2020-180626

(51) Int. Cl.
*H01Q 1/22* (2006.01)
*H01Q 1/38* (2006.01)
*H05K 3/34* (2006.01)
*H05K 1/18* (2006.01)

(52) U.S. Cl.
CPC ............. *H01Q 1/38* (2013.01); *H05K 1/184* (2013.01); *H05K 3/341* (2013.01)

(58) Field of Classification Search
CPC .......... H01Q 1/38; H01Q 1/1207; H01Q 7/00; H01Q 1/22; H01Q 1/36; H01Q 1/50; H05K 1/184; H05K 3/341; H05K 3/34; H05K 2201/10098; H05K 1/182
See application file for complete search history.

(56) References Cited

U.S. PATENT DOCUMENTS

| | | | |
|---|---|---|---|
| 7,362,285 B2 | 4/2008 | Webb et al. | |
| 7,408,525 B2 | 8/2008 | Webb et al. | |
| 7,548,216 B2 | 6/2009 | Webb et al. | |
| 7,573,436 B2 | 8/2009 | Webb et al. | |
| 2004/0095290 A1* | 5/2004 | Chen .................. | H01Q 1/1207 343/702 |

(Continued)

FOREIGN PATENT DOCUMENTS

| | | |
|---|---|---|
| CN | 100385734 C | 4/2008 |
| CN | 104916898 A | 9/2015 |
| JP | 2006270850 A | 10/2006 |

(Continued)

OTHER PUBLICATIONS

Taiwanese Office Action (and English language translation thereof) dated Dec. 9, 2022, issued in counterpart Taiwanese Application No. 110132592.

*Primary Examiner* — David E Lotter
(74) *Attorney, Agent, or Firm* — Holtz, Holtz & Volek PC

(57) ABSTRACT

An antenna is configured to be soldered on a circuit board. The antenna comprises a main portion, at least one soldering terminal and at least one fixed portion. The main portion has a height in a vertical direction. The main portion is, at least in part, positioned below the soldering terminal in the vertical direction when the soldering terminal is soldered on the circuit board. The soldering terminal extends from the main portion along a horizontal plane perpendicular to the vertical direction. When the soldering terminal is soldered on the circuit board, the fixed portion is fixed on the circuit board at a location different from a location of the soldering terminal.

11 Claims, 13 Drawing Sheets

(56) References Cited

U.S. PATENT DOCUMENTS

2004/0252063 A1  12/2004  Sadamori et al.
2005/0280598 A1* 12/2005  Webb .................... H01Q 7/005
                                                343/867

FOREIGN PATENT DOCUMENTS

| JP | 2008503986 A | 2/2008 |
| JP | 2012221872 A | 11/2012 |
| JP | 2013183204 A | 9/2013 |

* cited by examiner

__US 11,888,219 B2__

ANTENNA AND ASSEMBLY

CROSS REFERENCE TO RELATED APPLICATIONS

This application is based on and claims priority under 35 U.S.C. § 119 to Japanese Patent Application No. JP2020-180626 filed Oct. 28, 2020, the contents of which are incorporated herein in their entirety by reference.

BACKGROUND OF THE INVENTION

This invention relates to an antenna which is configured to be attached to a circuit board.

Referring to FIG. 25, JPA2013-183204 (Patent Document 1) discloses antennas 900 of this type. Each antenna 900 is fixed on a reflective surface 952 of a reflective plate 950, or a circuit board 950, by a securing bracket 960 and bolts 970.

In such an antenna as the antenna 900 of Patent Document 1, a portion of the antenna, which protrudes outward from a circuit board, is required to have a reduced size.

SUMMARY OF THE INVENTION

It is therefore an object of the present invention to provide an antenna whose portion, which protrudes outward from a circuit board, has a reduced size.

One aspect of the present invention provides an antenna which is configured to be soldered on a circuit board. The antenna comprises a main portion, at least one soldering terminal and at least one fixed portion. The main portion has a height in a vertical direction. The main portion is, at least in part, positioned below the soldering terminal in the vertical direction when the soldering terminal is soldered on the circuit board. The soldering terminal extends from the main portion along a horizontal plane perpendicular to the vertical direction. When the soldering terminal is soldered on the circuit board, the fixed portion is fixed on the circuit board at a location different from a location of the soldering terminal.

The antenna of the present invention is configured so that the main portion is, at least in part, positioned below the soldering terminal in the vertical direction when the soldering terminal is soldered on the circuit board. Accordingly, the antenna of the present invention is configured so that a part of the main portion is positioned within a thickness of the circuit board when the antenna is attached to the circuit board. In other words, a portion of the antenna of the present invention, which protrudes outward from the circuit board, has a reduced size.

An appreciation of the objectives of the present invention and a more complete understanding of its structure may be had by studying the following description of the preferred embodiment and by referring to the accompanying drawings.

Figure 1:
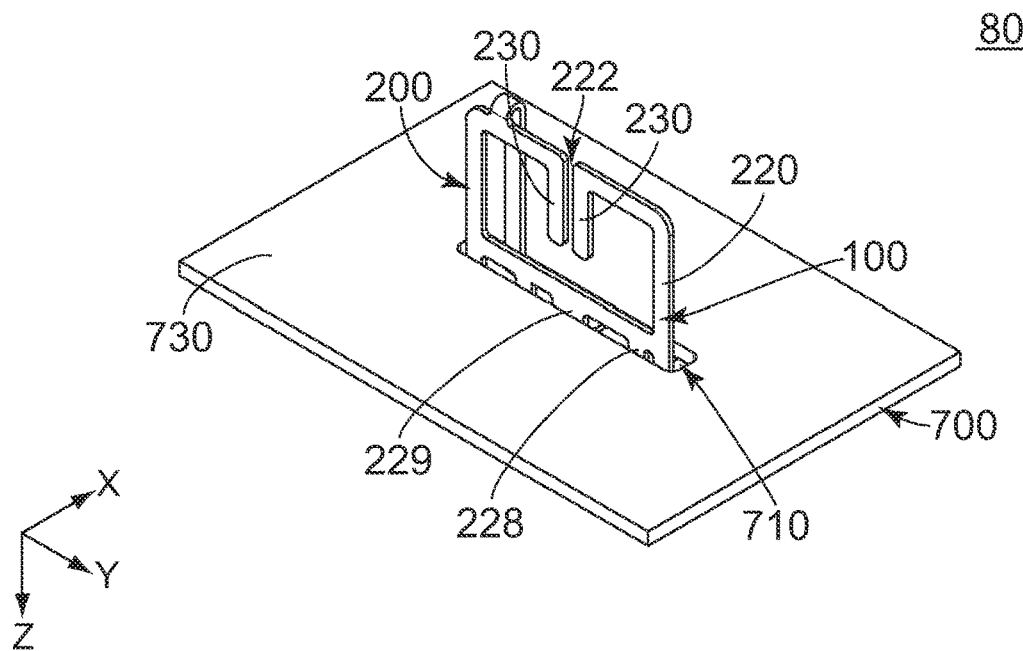
FIG. 1 is a bottom, perspective view showing an assembly according to a first embodiment of the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DESCRIPTION OF PREFERRED EMBODIMENTS

First Embodiment

As shown in FIG. 1, an assembly 800 according to a first embodiment of the present invention comprises a circuit board 700 and an antenna 100.

Figure 8:
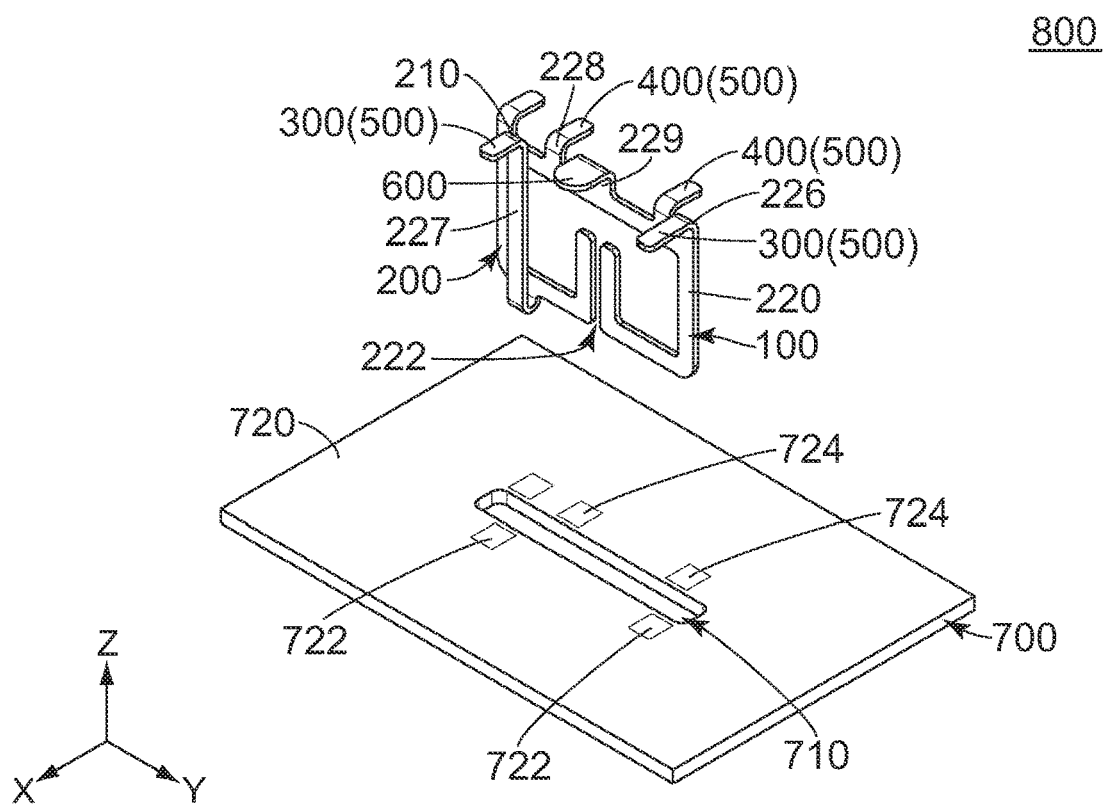
FIG. 8 is a perspective view explanatory of a method of assembling the assembly of FIG. 1. In the figure, an antenna is not attached to a circuit board.

As shown in FIG. 8, the circuit board 700 of the present embodiment is formed with an opening 710. The opening 710 pierces the circuit board 700 in a vertical direction. In the present embodiment, the vertical direction is a Z-direction. In addition, the vertical direction is also referred to as an up-down direction. Specifically, it is assumed that upward is a positive Z-direction while downward is a negative Z-direction. As shown in FIGS. 1 and 8, the circuit board 700 has an upper surface 720 and a lower surface 730. The upper surface 720 of the circuit board 700 is formed with pads 722, 724. However, the present invention is not limited thereto. The upper surface 720 of the circuit board 700 should be formed with at least one pad 722.

Figure 2:
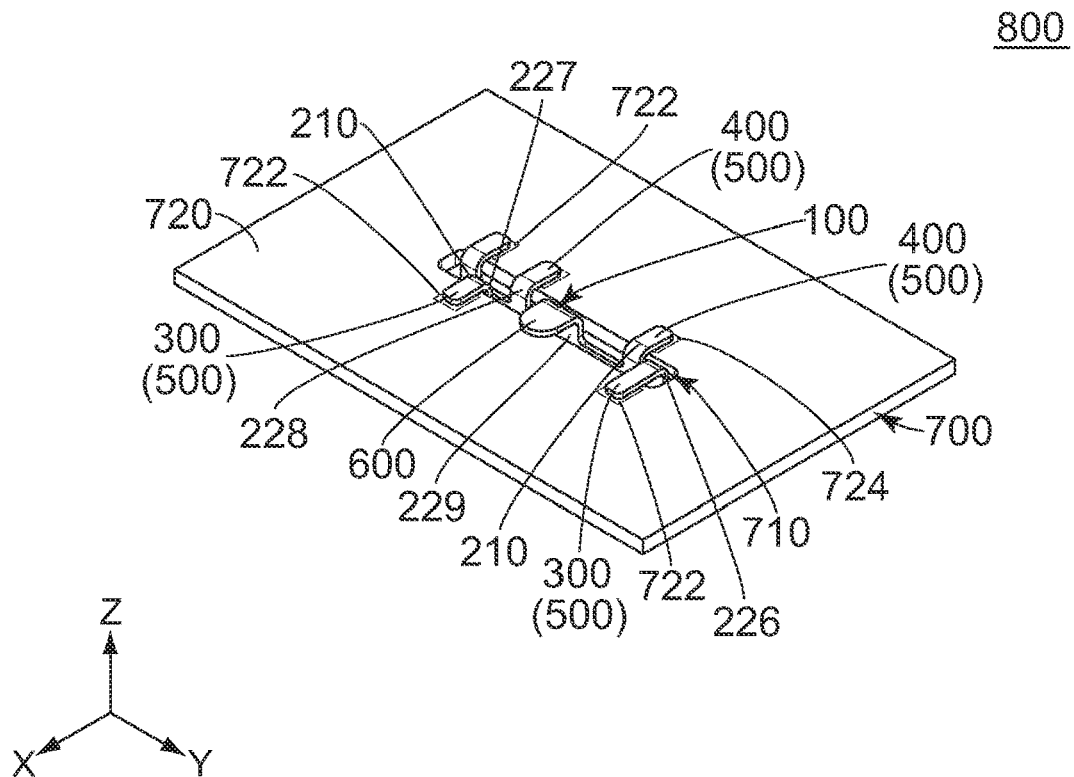
FIG. 2 is a top, perspective view showing the assembly of FIG. 1.
Figure 3:
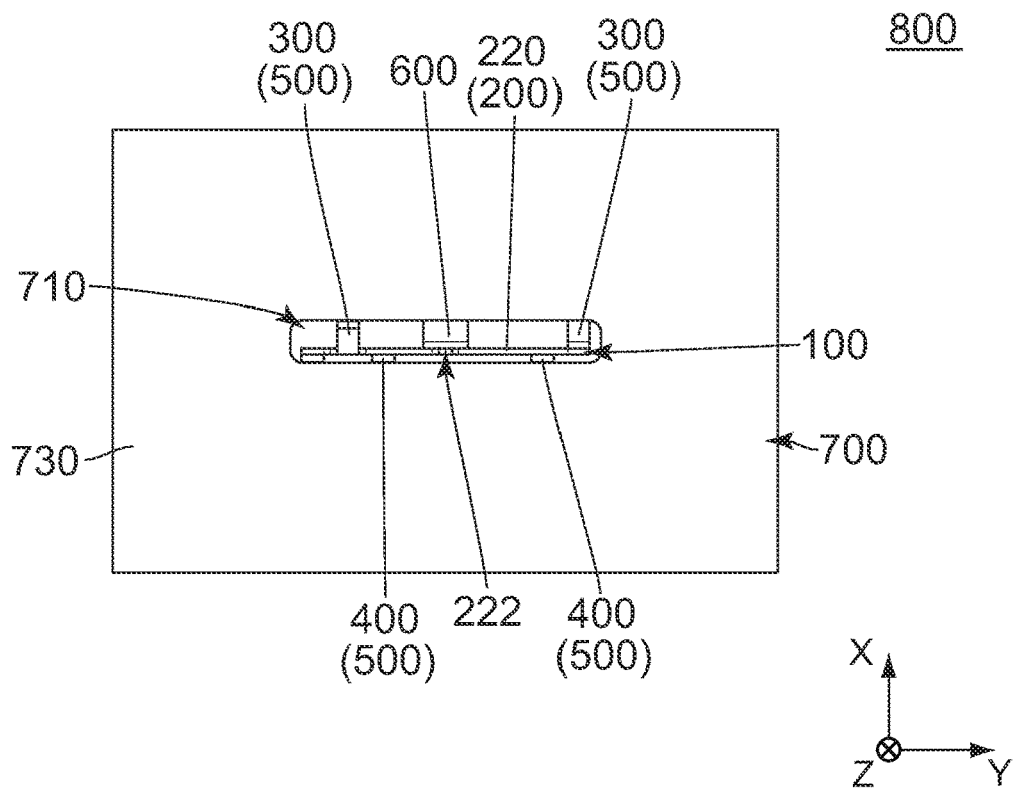
FIG. 3 is a bottom view showing the assembly of FIG. 1.

Referring to FIG. 8, the antenna 100 of the present embodiment is made of metal. As shown in FIG. 2, the antenna 100 is attached to the circuit board 700. More specifically, the antenna 100 is soldered on the circuit board 700.

As shown in FIG. 8, the antenna 100 comprises a main portion 200, two soldering terminals 300 and two fixed portions 400. However, the present invention is not limited thereto. The antenna 100 should comprise the main portion 200, at least one soldering terminal 300 and at least one fixed portion 400.

Figure 7:
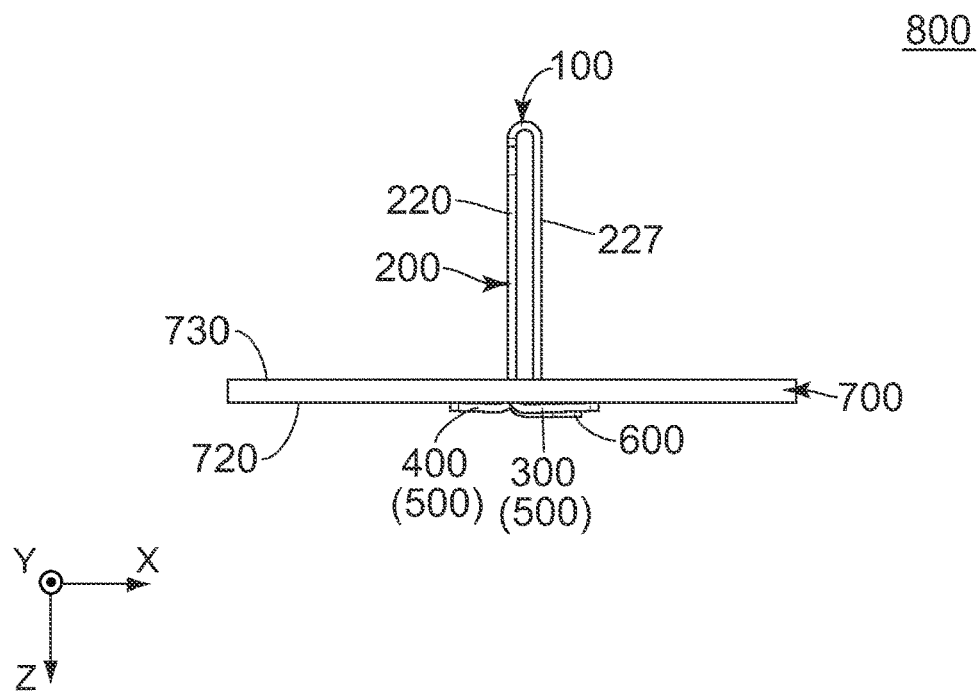
FIG. 7 is a side view showing the assembly of FIG. 1.

As shown in FIG. 8, the main portion 200 of the present embodiment has a height in the vertical direction, or in the up-down direction. The main portion 200 may be formed by bending a plate metal. In addition, the main portion 200 may have any three-dimensional shape, such as cylindrical or rectangular forms. As shown in FIG. 7, the main portion 200 is, at least in part, positioned below the soldering terminal 300 in the vertical direction when the soldering terminals 300 are soldered on the circuit board 700. As shown in FIG. 1, the main portion 200, at least in part, extends to a lower side of the circuit board 700 through the opening 710.

As described above, the antenna 100 of the present embodiment is configured so that the main portion 200 is, at least in part, positioned below the soldering terminal 300 in the vertical direction when the soldering terminals 300 are soldered on the circuit board 700. Accordingly, the antenna 100 of the present embodiment is configured so that a part of the main portion 200 is positioned within a thickness of the circuit board 700 when the antenna 100 is attached to the circuit board 700. In other words, a portion of the antenna 100 of the present embodiment, which protrudes outward from the circuit board 700, has a reduced size.

Figure 5:
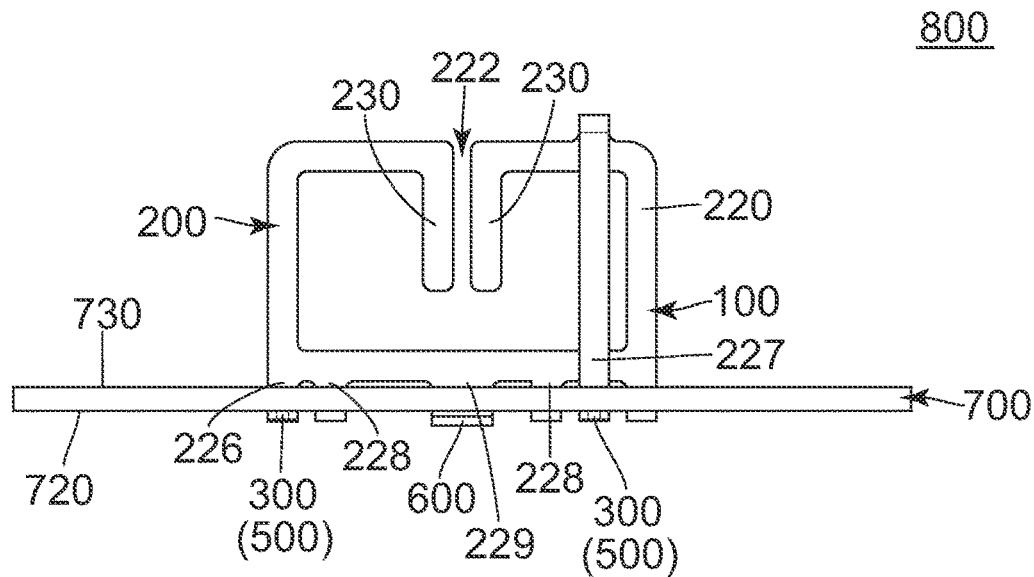
FIG. 5 is a front view showing the assembly of FIG. 1.
Figure 5:
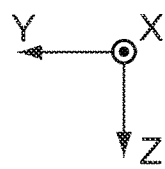
Figure 6:
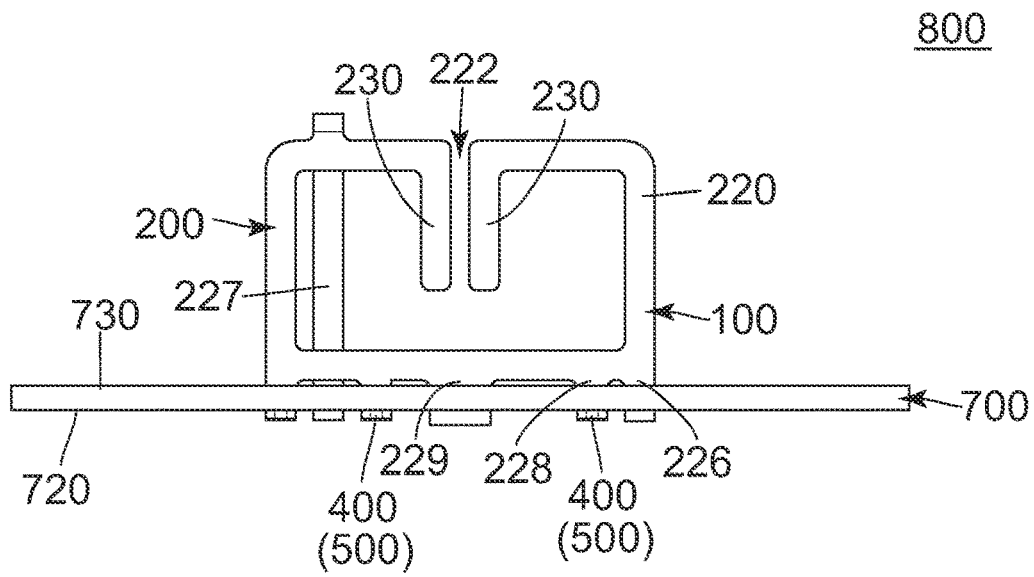
FIG. 6 is a rear view showing the assembly of FIG. 1.
Figure 6:
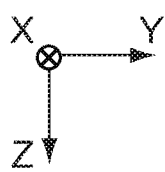

As shown in FIG. 5, the main portion 200 has a frame body 220, two facing portions 230, two first coupling portions 226, 227, two second coupling portions 228 and a third coupling portion 229. Specifically, the frame body 220 has a split 222.

As shown in FIG. 5, the frame body 220 of the present embodiment defines a lower end of the main portion 200 in the up-down direction. The frame body 220 has a substantially plate-like shape. More specifically, the frame body 220 has the substantially plate-like shape in a plane perpendicular to a front-rear direction. In the present embodiment, the front-rear direction is an X-direction. Specifically, it is assumed that forward is a positive X-direction while rearward is a negative X-direction. The frame body 220 defines opposite ends of the main portion 200 in a right-left direction. In the present embodiment, the right-left direction is a Y-direction. Specifically, it is assumed that rightward is a positive Y-direction while leftward is a negative Y-direction. The frame body 220 is positioned below the lower surface 730 of the circuit board 700 in the vertical direction when the soldering terminals 300 are soldered on the circuit board 700. The frame body 220 is not positioned within the thickness of the circuit board 700 when the soldering terminals 300 are soldered on the circuit board 700.

As shown in FIG. 8, the first coupling portion 226 of the present embodiment extends upward in the up-down direction from an upper end of the frame body 220. The first coupling portion 226 couples the frame body 220 and one of the soldering terminals 300 with each other. As shown in FIG. 2, a part of the first coupling portion 226 is positioned above the upper surface 720 of the circuit board 700 in the up-down direction when the soldering terminals 300 are soldered on the circuit board 700. Another part of the first coupling portion 226 is positioned within the thickness of the circuit board 700 when the soldering terminals 300 are soldered on the circuit board 700. In other words, the latter part of the first coupling portion 226 is positioned within the opening 710 of the circuit board 700 when the soldering terminals 300 are soldered on the circuit board 700. Referring to FIG. 5, a center of gravity of the antenna 100 is positioned below the first coupling portion 226 in the vertical direction.

As shown in FIG. 8, the first coupling portion 227 of the present embodiment extends upward in the up-down direction from a lower end of the frame body 220. The first coupling portion 227 couples the frame body 220 and a remaining one of the soldering terminals 300 with each other. As shown in FIG. 2, a part of the first coupling portion 227 is positioned above the upper surface 720 of the circuit board 700 in the up-down direction when the soldering terminals 300 are soldered on the circuit board 700. Another part of the first coupling portion 227 is positioned within the thickness of the circuit board 700 when the soldering terminals 300 are soldered on the circuit board 700. In other words, the latter part of the first coupling portion 227 is positioned within the opening 710 of the circuit board 700 when the soldering terminals 300 are soldered on the circuit board 700.

As shown in FIG. 8, the second coupling portion 228 of the present embodiment extends upward in the up-down direction from the upper end of the frame body 220. The second coupling portion 228 couples the frame body 220 and the fixed portion 400 with each other. As shown in FIG. 2, a part of the second coupling portion 228 is positioned above the upper surface 720 of the circuit board 700 in the up-down direction when the soldering terminals 300 are soldered on the circuit board 700. Another part of the second coupling portion 228 is positioned within the thickness of the circuit board 700 when the soldering terminals 300 are soldered on the circuit board 700. In other words, the latter part of the second coupling portion 228 is positioned within the opening 710 of the circuit board 700 when the soldering terminals 300 are soldered on the circuit board 700. Referring FIG. 5, the center of gravity of the antenna 100 is positioned below the second coupling portion 228 in the vertical direction.

As shown in FIG. 8, the third coupling portion 229 of the present embodiment extends upward in the up-down direction from the upper end of the frame body 220. As shown in FIG. 2, a part of the third coupling portion 229 is positioned above the upper surface 720 of the circuit board 700 in the up-down direction when the soldering terminals 300 are soldered on the circuit board 700. Another part of the third coupling portion 229 is positioned within the thickness of the circuit board 700 when the soldering terminals 300 are soldered on the circuit board 700. In other words, the latter part of the third coupling portion 229 is positioned within the opening 710 of the circuit board 700 when the soldering terminals 300 are soldered on the circuit board 700. Referring to FIG. 5, the center of gravity of the antenna 100 is positioned below the third coupling portion 229 in the vertical direction.

As shown in FIG. 5, the two facing portions 230 of the present embodiment extend inward from opposite ends, respectively, of the split 222 in the plane perpendicular to the front-rear direction. Each of the facing portions 230 extends inward in the vertical direction from an end of the split 222. More specifically, each of the facing portions 230 extends upward in the up-down direction from the end of the split 222. The two facing portions 230 are parallel to each other. Each of the facing portions 230 is positioned below the lower surface 730 of the circuit board 700 in the up-down direction when the soldering terminals 300 are soldered on the circuit board 700. None of the facing portions 230 are positioned within the thickness of the circuit board 700 when the soldering terminals 300 are soldered on the circuit board 700.

As shown in FIG. 2, the main portion 200 has an upper end 210 in the vertical direction, and each of the soldering terminals 300 of the present embodiment extends from the upper end 210 of the main portion 200. Each of the soldering terminals 300 extends from the main portion 200 along a horizontal plane perpendicular to the vertical direction. In other words, each of the soldering terminals 300 extends from the main portion 200 along the horizontal plane parallel to the circuit board 700. In the present embodiment, the horizontal plane is an XY-plane. The one of the soldering terminals 300 extends from the first coupling portion 226 of the main portion 200 along the horizontal plane perpendicular to the vertical direction, and the remaining one of the soldering terminals 300 extends from the first coupling portion 227 of the main portion 200 along the horizontal plane. More specifically, the one of the soldering terminals 300 extends outward in the front-rear direction from the first coupling portion 226 of the main portion 200, and the remaining one of the soldering terminals 300 extends outward in the front-rear direction from the first coupling portion 227 of the main portion 200. Referring to FIG. 7, the center of gravity of the antenna 100 is positioned below the soldering terminal 300 in the vertical direction.

As shown in FIG. 2, the soldering terminal 300 is fixed on the upper surface 720 of the circuit board 700. When the antenna 100 is attached to the circuit board 700, each of the soldering terminals 300 is fixed on the circuit board 700 at a location different from any of locations of the fixed portions 400. More specifically, the soldering terminals 300 correspond to the fixed portions 400, respectively, and each of the soldering terminals 300 is fixed on the circuit board 700 at the location which is positioned outward in the right-left direction beyond the corresponding fixed portion 400 when the antenna 100 is attached to the circuit board 700. The soldering terminal 300 is fixed on the circuit board 700 by soldering. More specifically, the soldering terminal 300 is fixed on the pad 722 by soldering.

As shown in FIG. 2, each of the soldering terminals 300 is positioned above the upper surface 720 of the circuit board 700 in the up-down direction when the antenna 100 is attached to the circuit board 700. In other words, none of the soldering terminals 300 are positioned within the thickness of the circuit board 700 when the antenna 100 is attached to the circuit board 700.

As shown in FIG. 2, each of the fixed portions 400 of the present embodiment extends from the upper end 210 of the main portion 200. Each of the fixed portions 400 extends from the main portion 200 along the horizontal plane perpendicular to the vertical direction. In other words, each of the fixed portions 400 extends from the main portion 200 along the horizontal plane parallel to the circuit board 700. The fixed portion 400 extends from the second coupling portion 228 of the main portion 200 along the horizontal plane. More specifically, the fixed portion 400 extends outward in the front-rear direction from the second coupling portion 228 of the main portion 200. Referring to FIG. 7, the center of gravity of the antenna 100 is positioned below the fixed portion 400 in the vertical direction.

As shown in FIG. 2, the fixed portion 400 is fixed on the upper surface 720 of the circuit board 700. When the soldering terminals 300 are soldered on the circuit board 700, each of the fixed portions 400 is fixed on the circuit board 700 at the location different from any of the locations of the soldering terminals 300. More specifically, when the soldering terminals 300 are soldered on the circuit board 700, each of the fixed portions 400 is fixed on the circuit board 700 at the location which is positioned inward in the right-left direction beyond the corresponding soldering terminal 300. The fixed portion 400 is fixed on the circuit board 700 by soldering. More specifically, the fixed portion 400 is fixed on the pad 724 of the circuit board 700 by soldering. The fixed portion 400 may or may not be electrically connected with the pad 724.

As shown in FIG. 2, each of the fixed portions 400 is positioned above the upper surface 720 of the circuit board 700 in the up-down direction when the antenna 100 is attached to the circuit board 700. In other words, none of the fixed portions 400 are positioned within the thickness of the circuit board 700 when the antenna 100 is attached to the circuit board 700.

As shown in FIG. 8, the antenna 100 of the present embodiment comprises two mounting sets 500. Each of the mounting sets 500 is composed of the soldering terminal 300 and the fixed portion 400.

As shown in FIG. 8, the antenna 100 of the present embodiment further comprises a suction portion 600.

Figure 4:
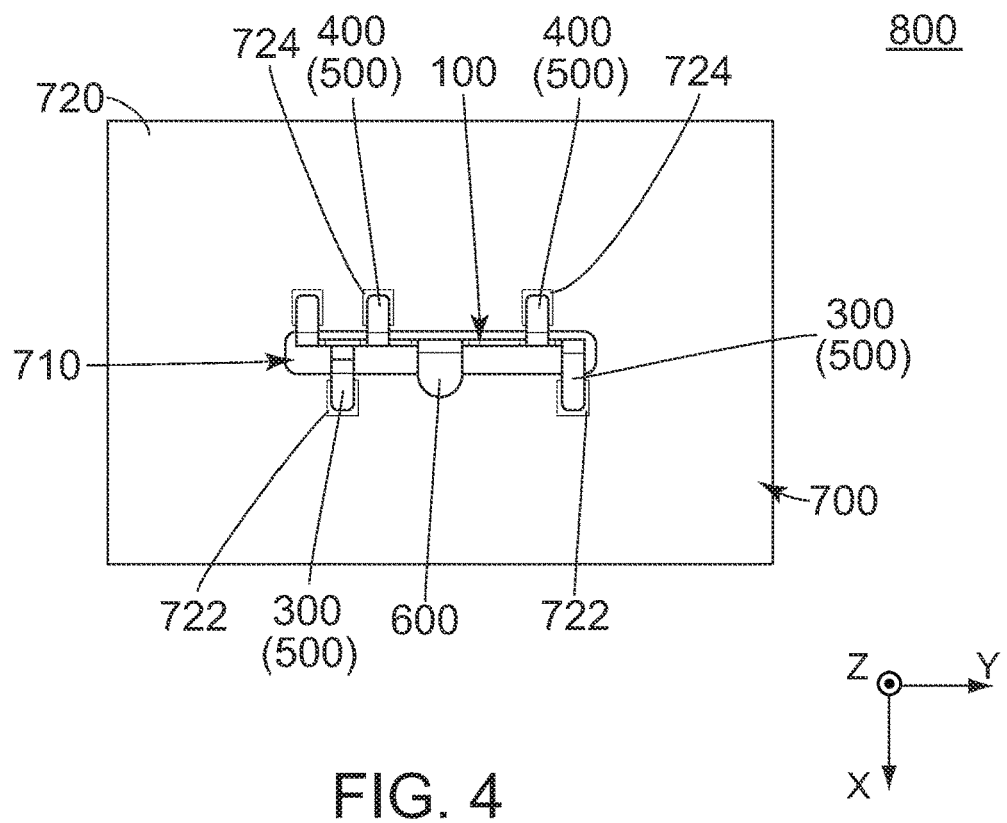
FIG. 4 is a top view showing the assembly of FIG. 1.

As shown in FIG. 4, the suction portion 600 is positioned between the two mounting sets 500. As shown in FIG. 8, the suction portion 600 of the present embodiment is coupled with the third coupling portion 229 in the vertical direction. In other words, the third coupling portion 229 couples the suction portion 600 and the frame body 220 with each other. The suction portion 600 extends outward in the front-rear direction from an upper end of the third coupling portion 229. The suction portion 600 has a plane perpendicular to the vertical direction. As shown in FIG. 7, the suction portion 600 is positioned above the soldering terminal 300 in the vertical direction. However, the present invention is not limited thereto. The suction portion 600 should be configured so that, in the vertical direction, the suction portion 600 is positioned at a location same as the location of the soldering terminal 300 or is positioned above the soldering terminal 300. The suction portion 600 defines an upper end of the antenna 100.

As shown in FIG. 2, the suction portion 600 is positioned above the upper surface 720 of the circuit board 700 in the up-down direction when the antenna 100 is attached to the circuit board 700. In other words, the suction portion 600 is not positioned within the thickness of the circuit board 700 when the antenna 100 is attached to the circuit board 700.

Since the antenna 100 of the present embodiment has the aforementioned suction portion 600, the whole of the antenna 100 can be lifted up by picking the suction portion 600 up by the use of a vacuum chuck. Thus, the antenna 100 of the present embodiment is easily handled in an automatic component feeder system.

Second Embodiment

Figure 9:
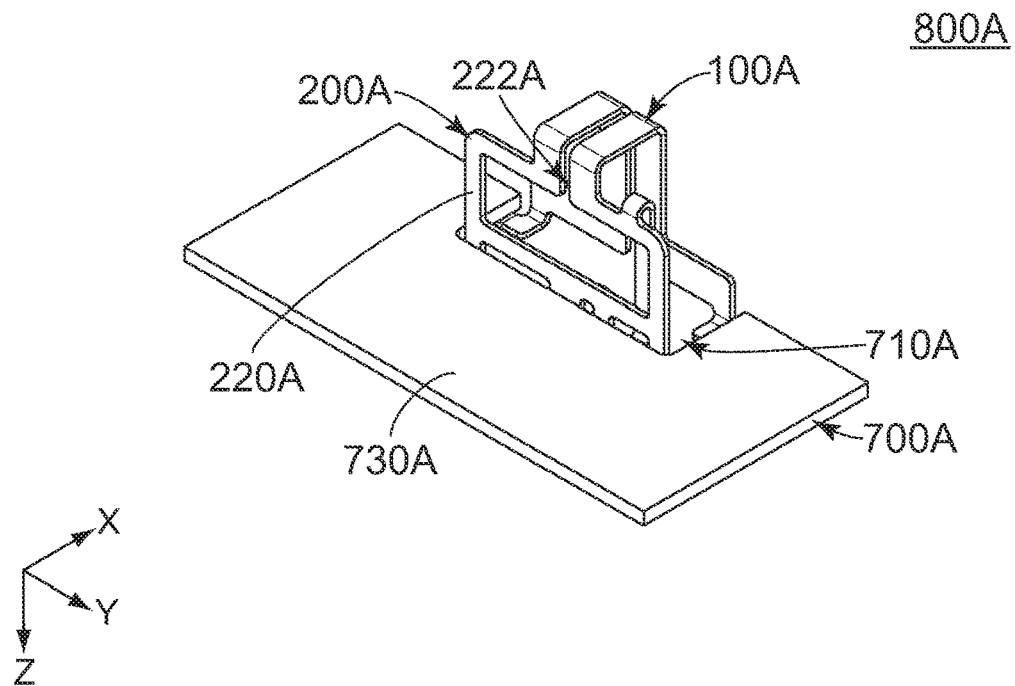
FIG. 9 is a bottom, perspective view showing an assembly according to a second embodiment of the present invention.

As shown in FIG. 9, an assembly 800A according to a second embodiment of the present invention comprises a circuit board 700A and an antenna 100A. As for directions and orientations in the present embodiment, expressions same as those of the first embodiment will be used hereinbelow.

Figure 16:
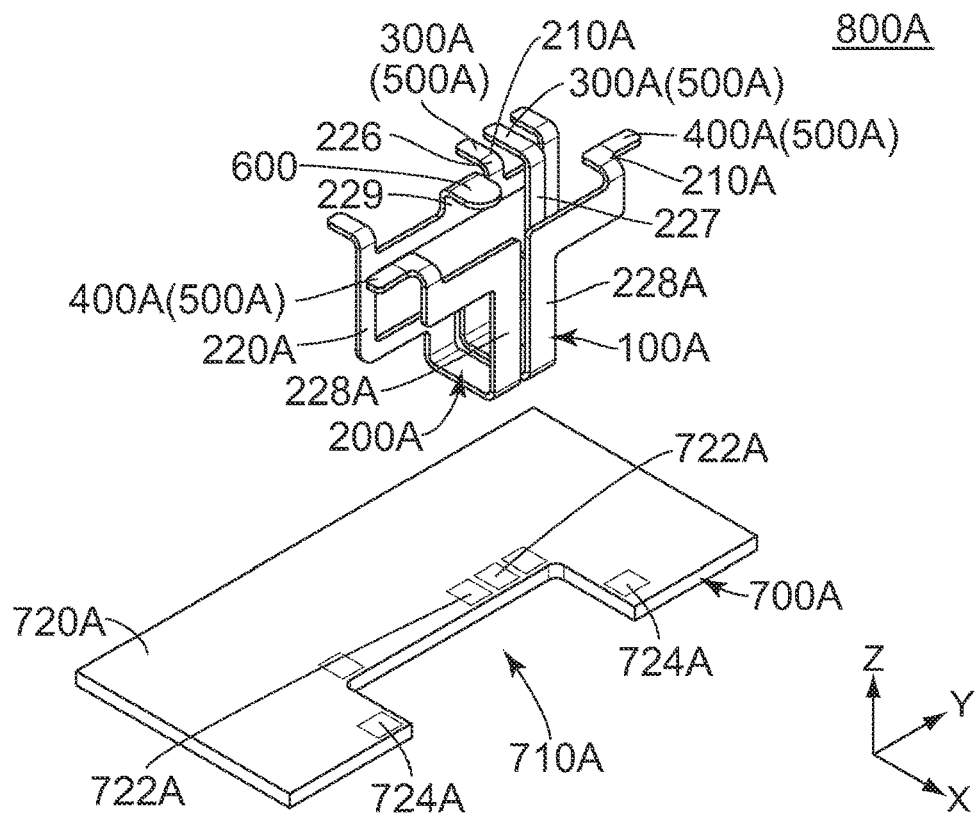
FIG. 16 is a perspective view explanatory of a method of assembling the assembly of FIG. 9. In the figure, an antenna is not attached to a circuit board.

As shown in FIG. 16, the circuit board 700A of the present embodiment is formed with an opening 710A. The opening 710A has a cut-out shape. Specifically, the opening 710A pierces the circuit board 700A in the vertical direction and opens at its one end in the front-rear direction. As shown in FIGS. 9 and 16, the circuit board 700A has an upper surface 720A and a lower surface 730A. The upper surface 720A of the circuit board 700A is formed with pads 722A, 724A. However, the present invention is not limited thereto. The upper surface 720A of the circuit board 700A should be formed with at least one pad 722A.

Figure 10:
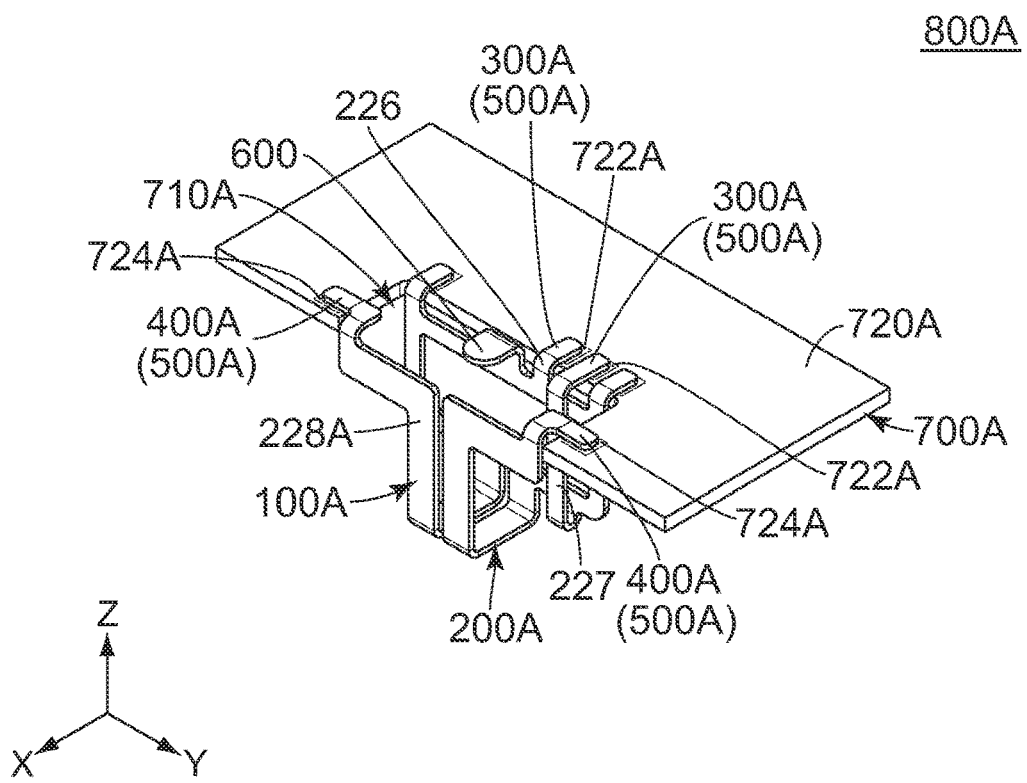
FIG. 10 is a top, perspective view showing the assembly of FIG. 9.
Figure 11:
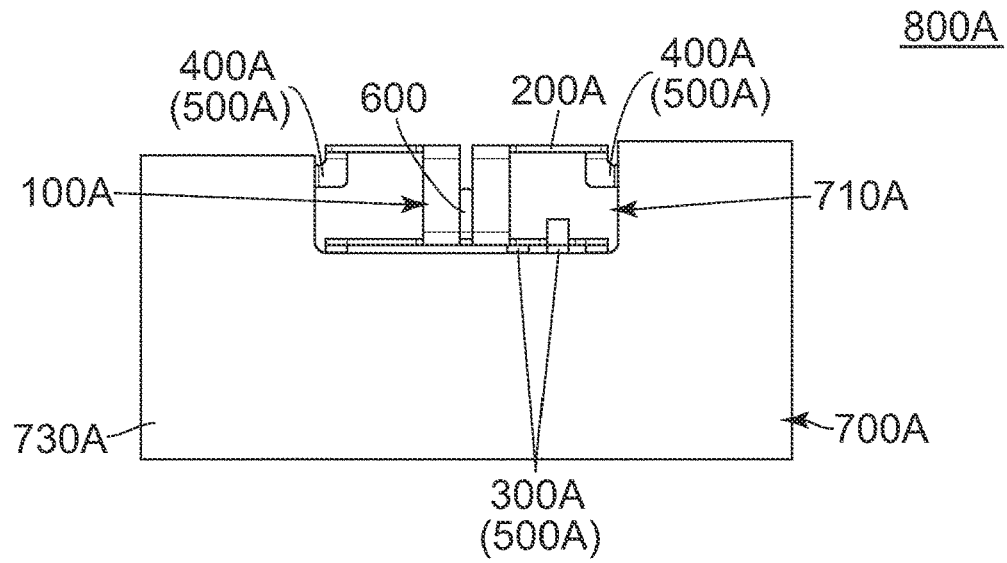
FIG. 11 is a bottom view showing the assembly of FIG. 9.

Referring to FIG. 16, the antenna 100A of the present embodiment is made of metal. As shown in FIG. 10, the antenna 100A is attached to the circuit board 700A. More specifically, the antenna 100A is soldered on the circuit board 700A.

As shown in FIG. 16, the antenna 100A of the present embodiment comprises a main portion 200A, two soldering terminals 300A and two fixed portions 400A. However, the present invention is not limited thereto. The antenna 100A should comprise the main portion 200A, at least one soldering terminal 300A and at least one fixed portion 400A.

Figure 15:
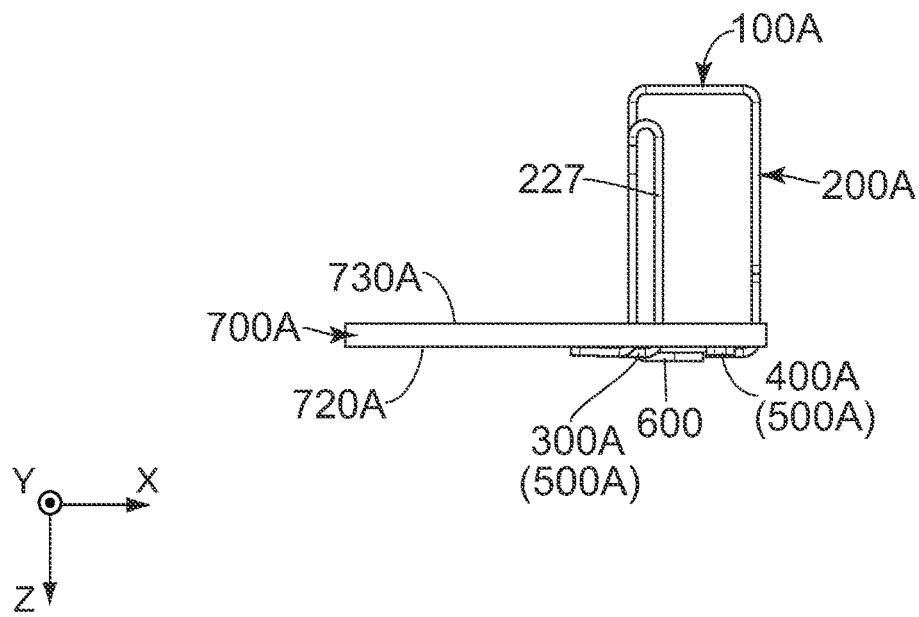
FIG. 15 is a side view showing the assembly of FIG. 9.

As shown in FIG. 16, the main portion 200A of the present embodiment has a height in the vertical direction, or in the up-down direction. As shown In FIG. 15, the main portion 200A is, at least in part, positioned below the soldering terminal 300A in the vertical direction when the soldering terminals 300A are soldered on the circuit board 700A. As shown in FIG. 10, the main portion 200A, at least in part, extends to a lower side of the circuit board 700A through the opening 710A.

As described above, the antenna 100A of the present embodiment is configured so that the main portion 200A is, at least in part, positioned below the soldering terminal 300A in the vertical direction when the soldering terminals 300A are soldered on the circuit board 700A. Accordingly, the antenna 100A of the present embodiment is configured so that a part of the main portion 200A is positioned within a thickness of the circuit board 700A when the antenna 100A is attached to the circuit board 700A. In other words, a portion of the antenna 100A of the present embodiment, which protrudes outward from the circuit board 700A, has a reduced size.

Figure 14:
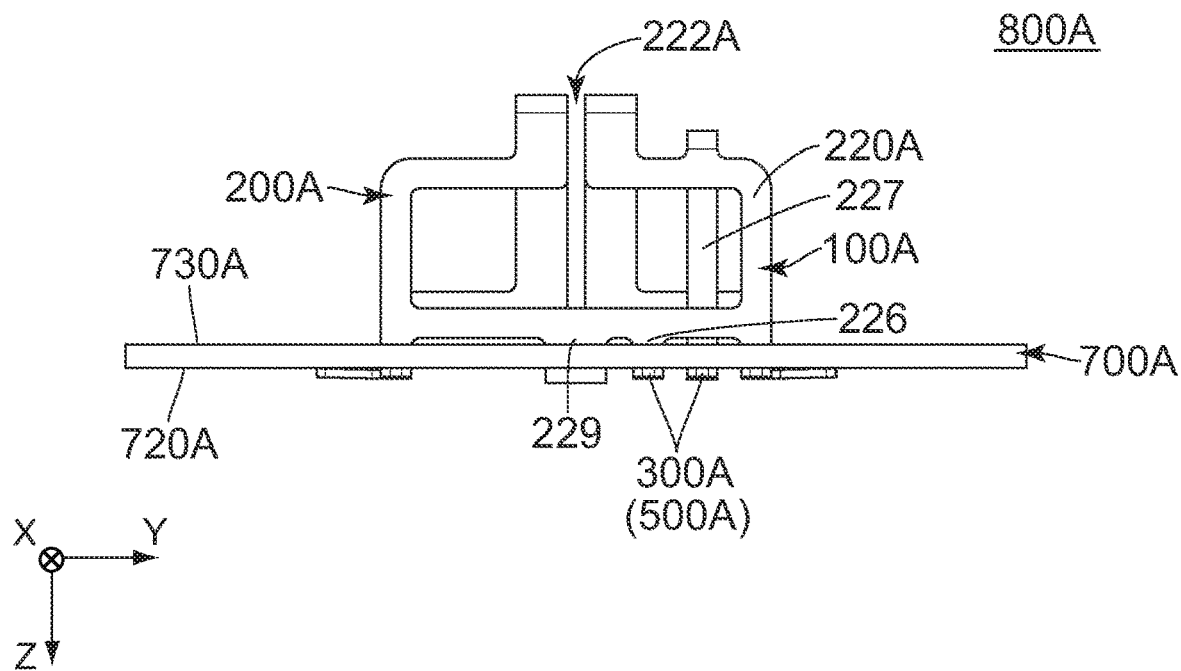
FIG. 14 is a rear view showing the assembly of FIG. 9.

As shown in FIGS. 14 and 16, the main portion 200A has a frame body 220A, two first coupling portions 226, 227, two second coupling portions 228A and a third coupling portion 229. Specifically, the frame body 220A has a split 222A. The first coupling portion 226 couples the frame body 220A and one of the soldering terminals 300 with each other. The first coupling portion 226 and the third coupling portion 229 of the present embodiment have structures same as those of the first coupling portion 226 and the third coupling portion 229 of the first embodiment. Accordingly, a detailed explanation thereabout is omitted.

As shown in FIG. 14, the frame body 220A of the present embodiment defines opposite ends of the main portion 200A in the right-left direction. The frame body 220A is positioned below the lower surface 730A of the circuit board 700A in the vertical direction when the soldering terminals 300A are soldered on the circuit board 700A. The frame body 220A is not positioned within the thickness of the circuit board 700A when the soldering terminals 300A are soldered on the circuit board 700A.

Figure 13:
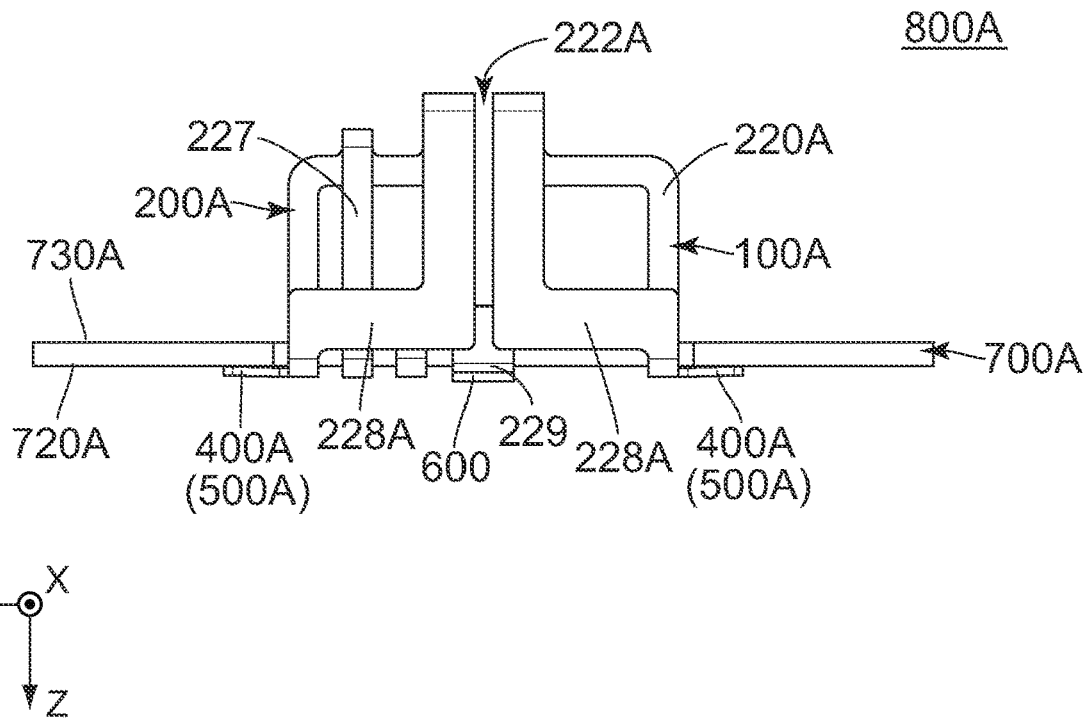
FIG. 13 is a front view showing the assembly of FIG. 9.

As shown in FIGS. 13 and 14, the first coupling portion 227 of the present embodiment extends upward in the up-down direction from a lower end of the frame body 220A. The first coupling portion 227 couples the frame body 220A and a remaining one of the soldering terminals 300A with each other. As shown in FIG. 10, a part of the first coupling portion 227 is positioned above the upper surface 720A of the circuit board 700A in the up-down direction when the soldering terminals 300A are soldered on the circuit board 700A. Another part of the first coupling portion 227 is positioned within the thickness of the circuit board 700A when the soldering terminals 300A are soldered on the circuit board 700A. In other words, the latter part of the first coupling portion 227 is positioned within the opening 710A of the circuit board 700A when the soldering terminals 300A are soldered on the circuit board 700A.

Referring to FIG. 16, the second coupling portion 228A of the present embodiment defines a lower end of the antenna 100A in the up-down direction. The second coupling portion 228A defines a front end of the antenna 100A in the front-rear direction. The second coupling portion 228A extends downward from the lower end of the frame body 220A, is bent to extend forward, is bent to extend upward, extends outward in the right-left direction and is then bent to extend rearward.

Referring to FIG. 14, a center of gravity of the antenna 100A is positioned below the first coupling portion 226 in the vertical direction. The center of gravity of the antenna 100A is positioned below the third coupling portion 229 in the vertical direction.

As shown in FIG. 16, the main portion 200A has an upper end 210A in the vertical direction, and each of the soldering terminals 300A of the present embodiment extends from the upper end 210A of the main portion 200A. As shown in FIG. 10, each of the soldering terminals 300A extends from the main portion 200A along the horizontal plane perpendicular to the vertical direction. In other words, each of the soldering terminals 300A extends from the main portion 200A along the horizontal plane parallel to the circuit board 700A. The one of the soldering terminals 300A extends from the first coupling portion 226 of the main portion 200A along the horizontal plane perpendicular to the vertical direction, and the remaining one of the soldering terminals 300A extends from the first coupling portion 227 of the main portion 200A along the horizontal plane. Specifically, the one of the soldering terminals 300A extends inward in the front-rear direction from the first coupling portion 226 of the main portion 200A, and the remaining one of the soldering terminals 300A extends inward in the front-rear direction from the first coupling portion 227 of the main portion 200A. More specifically, the one of the soldering terminals 300A extends rearward in the front-rear direction from the first coupling portion 226 of the main portion 200A, and the remaining one of the soldering terminals 300A extends rearward in the front-rear direction from the first coupling portion 227 of the main portion 200A. Referring to FIG. 15, the center of gravity of the antenna 100A is positioned below the soldering terminal 300A in the vertical direction.

As shown in FIG. 10, each of the soldering terminals 300A is fixed on the upper surface 720A of the circuit board 700A. When the antenna 100A is attached to the circuit board 700A, each of the soldering terminals 300A is fixed on the circuit board 700A at a location different from any of locations of the fixed portions 400A. More specifically, when the antenna 100A is attached to the circuit board 700A, each of the soldering terminals 300A is fixed on the circuit board 700A at the location which is positioned inward in the right-left direction beyond one of the fixed portions 400A. The soldering terminal 300A is fixed on the circuit board 700A by soldering. More specifically, the soldering terminal 300A is fixed on the pad 722A by soldering.

As shown in FIG. 10, each of the soldering terminals 300A is positioned above the upper surface 720A of the circuit board 700A in the up-down direction when the antenna 100A is attached to the circuit board 700A. In other words, none of the soldering terminals 300A are positioned within the thickness of the circuit board 700A when the antenna 100A is attached to the circuit board 700A.

As shown in FIG. 16, each of the fixed portions 400A of the present embodiment extends from the upper end 210A of the main portion 200A. As shown in FIG. 10, each of the fixed portions 400A extends from the main portion 200A along the horizontal plane. In other words, each of the fixed portions 400A extends from the main portion 200A along the horizontal plane parallel to the circuit board 700A. The fixed portion 400A extends along the horizontal plane in a direction different from a direction in which the soldering terminal 300A extends. The fixed portion 400A extends outward in the right-left direction from the main portion 200A. The fixed portion 400A extends along the horizontal plane from the second coupling portion 228A of the main portion 200A. More specifically, the fixed portion 400A extends outward in the right-left direction from the second coupling portion 228A of the main portion 200A. Referring to FIG. 15, the center of gravity of the antenna 100A is positioned below the fixed portion 400A in the vertical direction.

Figure 12:
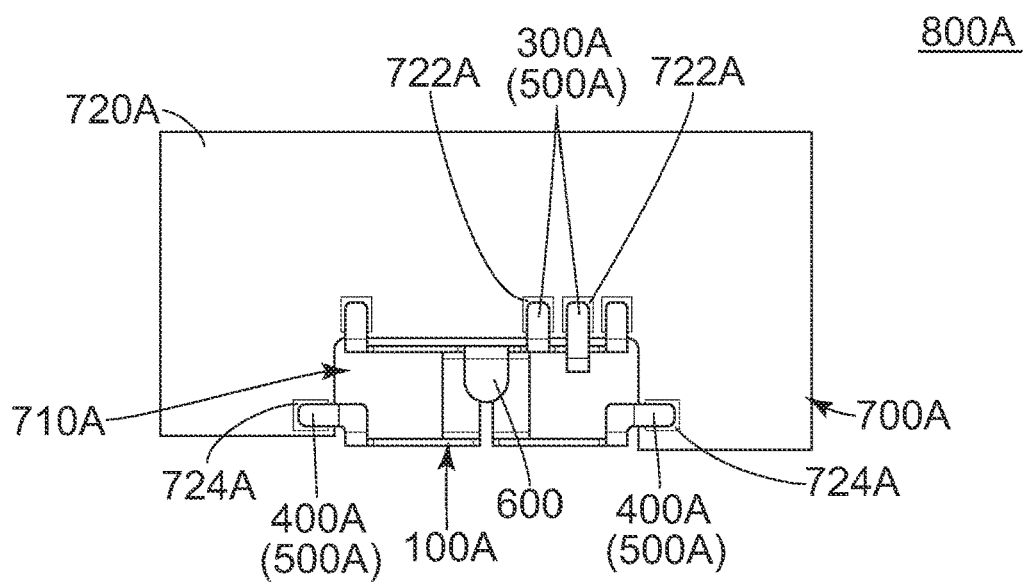
FIG. 12 is a top view showing the assembly of FIG. 9.

As shown in FIG. 12, the fixed portion 400A of the present embodiment is fixed on the upper surface 720A of the circuit board 700A. When the soldering terminals 300A are soldered on the circuit board 700A, each of the fixed portions 400A is fixed on the circuit board 700A at the location different from any of the locations of the soldering terminals 300A. More specifically, when the soldering terminals 300A are soldered on the circuit board 700A, the one of the fixed portions 400A is fixed on the circuit board 700A at the location which is positioned outward in the right-left direction beyond any of the soldering terminals 300A. The fixed portion 400A is fixed on the circuit board 700A by soldering. More specifically, the fixed portion 400A is fixed on the pad 724A of the circuit board 700A by soldering. The fixed portion 400A may or may not be electrically connected with the pad 724A.

As shown in FIG. 10, each of the fixed portions 400A is positioned above the upper surface 720A of the circuit board 700A in the up-down direction when the antenna 100A is attached to the circuit board 700A. In other words, none of the fixed portions 400A are positioned within the thickness of the circuit board 700A when the antenna 100A is attached to the circuit board 700A.

As shown in FIG. 16, the antenna 100A of the present embodiment comprises two mounting sets 500A. Each of the mounting sets 500A is composed of the soldering terminal 300A and the fixed portion 400A.

As shown in FIG. 16, the antenna 100A of the present embodiment further comprises a suction portion 600. The suction portion 600 of the present embodiment has a structure similar to that of the suction portion 600 of the first embodiment. Accordingly, a detailed explanation thereabout is omitted.

The antenna 100A of the present embodiment has the aforementioned suction portion 600. Accordingly, similar to the antenna 100 of the first embodiment, the whole of the antenna 100A can be lifted up by picking the suction portion 600 up by the use of a vacuum chuck. Thus, similar to the antenna 100 of the first embodiment, the antenna 100A of the present embodiment is easily handled in an automatic component feeder system.

Third Embodiment

Figure 24:
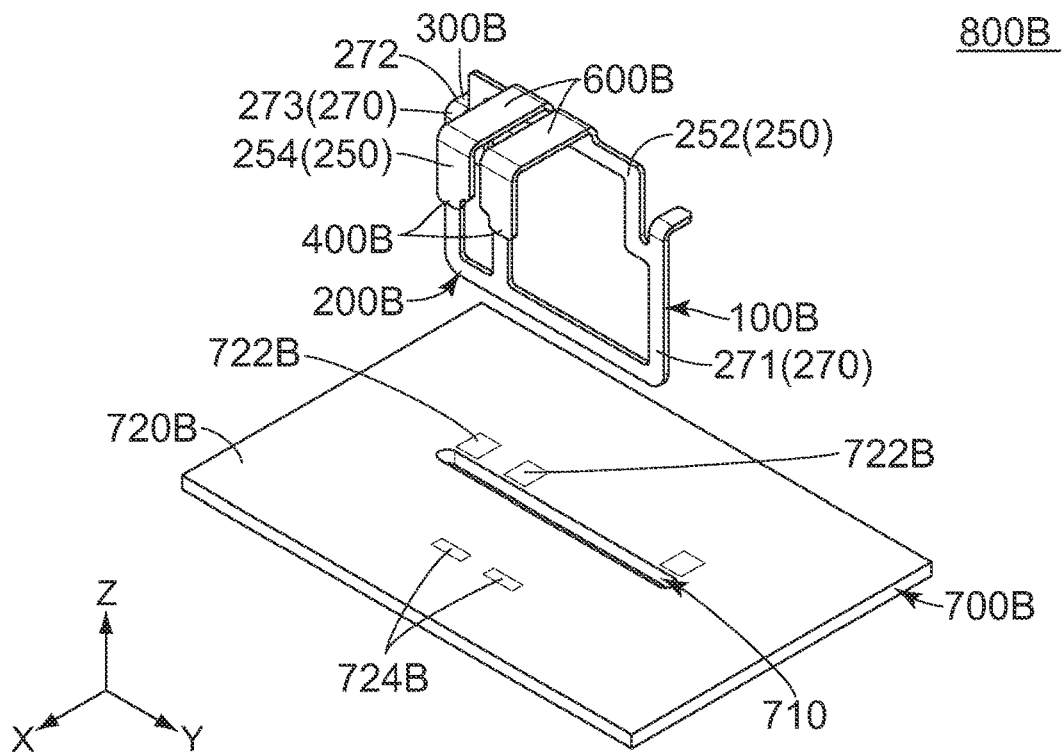
FIG. 24 is a perspective view explanatory of a method of assembling the assembly of FIG. 17. In the figure, an antenna is not attached to a circuit board.
Figure 25:
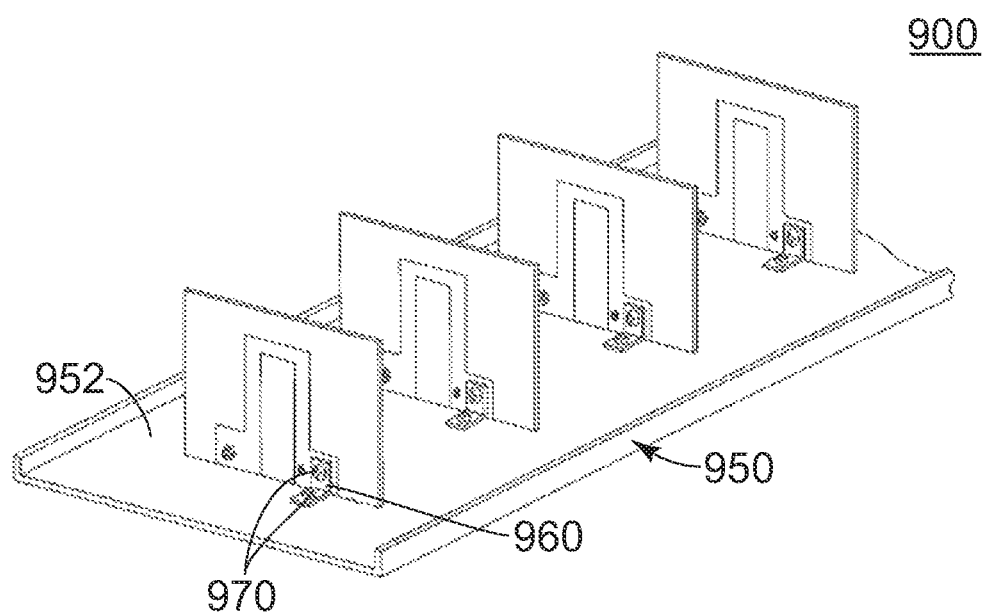
FIG. 25 is a perspective view showing antennas of Patent Document 1. In the figure, the antennas are attached to a reflective plate.

As shown in FIG. 24, an assembly 800B according to a third embodiment of the present invention comprises a circuit board 700B and an antenna 100B. As for directions and orientations in the present embodiment, expressions same as those of the first embodiment will be used hereinbelow.

Figure 17:
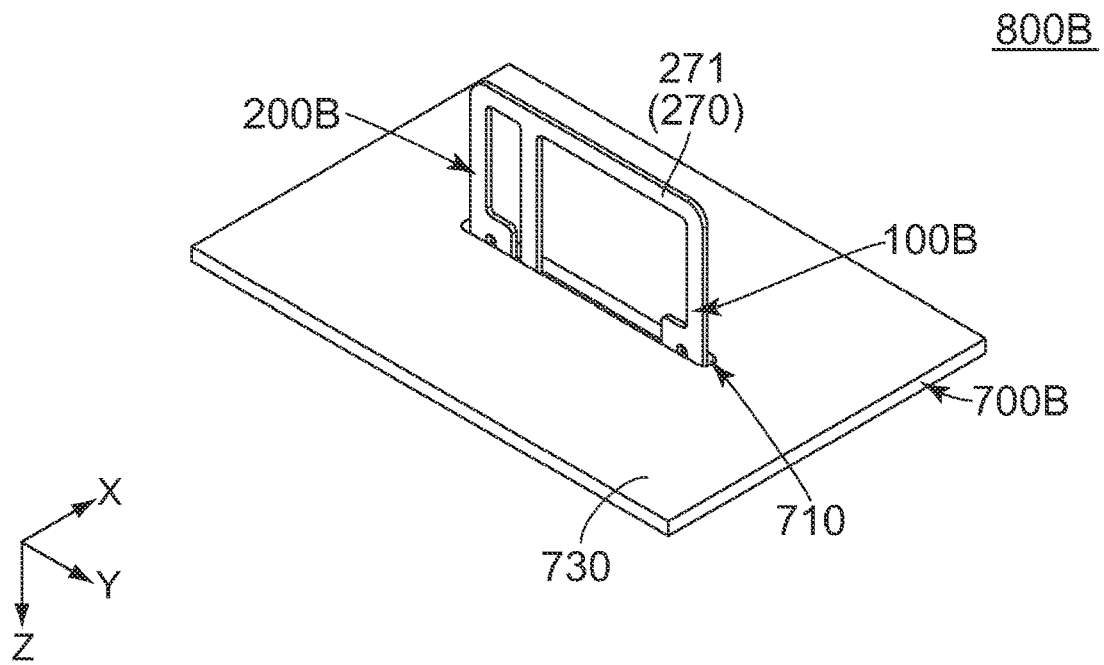
FIG. 17 is a bottom, perspective view showing an assembly according to a third embodiment of the present invention.

As shown in FIG. 24, the circuit board 700B of the present embodiment is formed with an opening 710. The opening 710 of the present embodiment has a structure similar to that of the opening 710 of the first embodiment. Accordingly, a detailed explanation thereabout is omitted. As shown in FIGS. 17 and 24, the circuit board 700B has an upper surface 720B and a lower surface 730. The upper surface 720B of the circuit board 700B is formed with pads 722B, 724B. However, the present invention is not limited thereto. The upper surface 720B of the circuit board 700B should be formed with at least one pad 722B.

Figure 18:
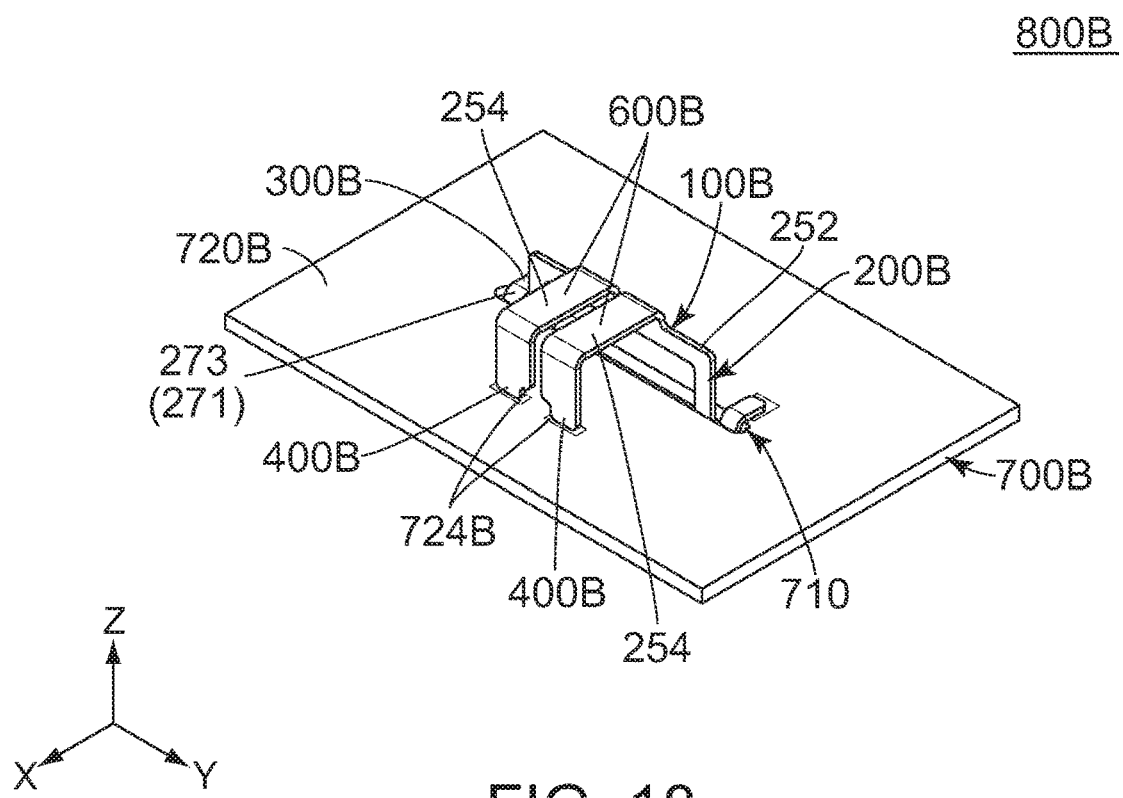
FIG. 18 is a top, perspective view showing the assembly of FIG. 17.
Figure 19:
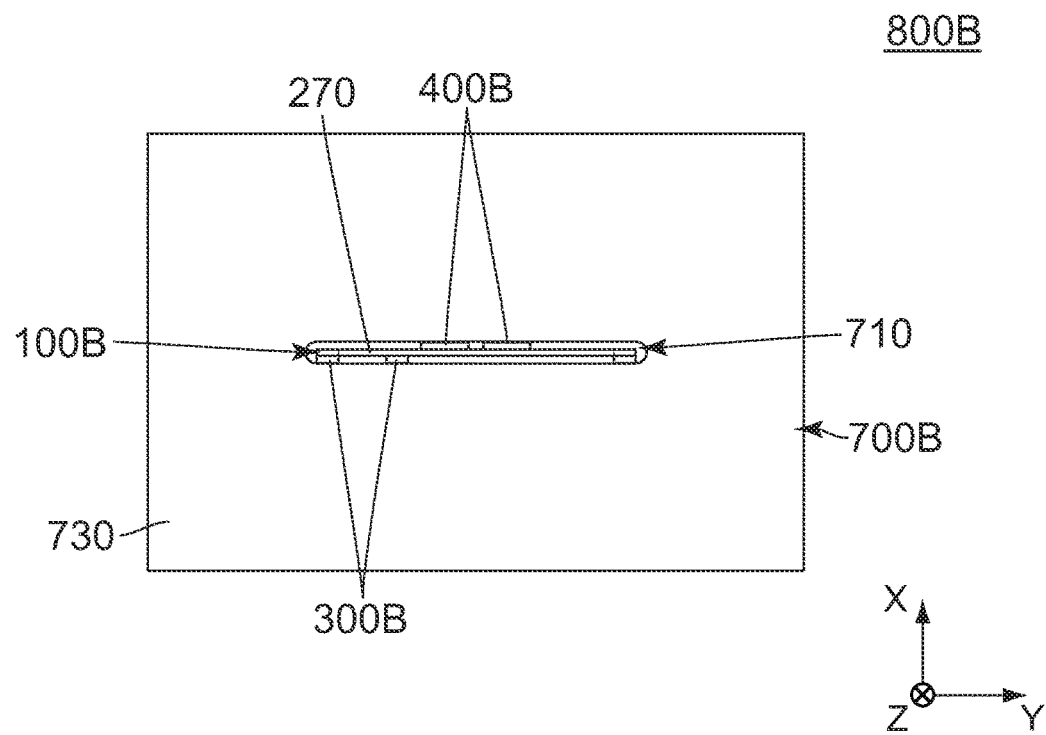
FIG. 19 is a bottom view showing the assembly of FIG. 17.

Referring to FIG. 24, the antenna 100B of the present embodiment is made of metal. As shown in FIG. 18, the antenna 100B of the present embodiment is attached to the circuit board 700B. More specifically, the antenna 100B is soldered on the circuit board 700B.

As shown in FIG. 24, the antenna 100B of the present embodiment comprises a main portion 200B, two soldering terminals 300B and two fixed portions 400B. However, the present invention is not limited thereto. The antenna 100B should comprise the main portion 200B, at least one soldering terminal 300B and at least one fixed portion 400B.

Figure 23:
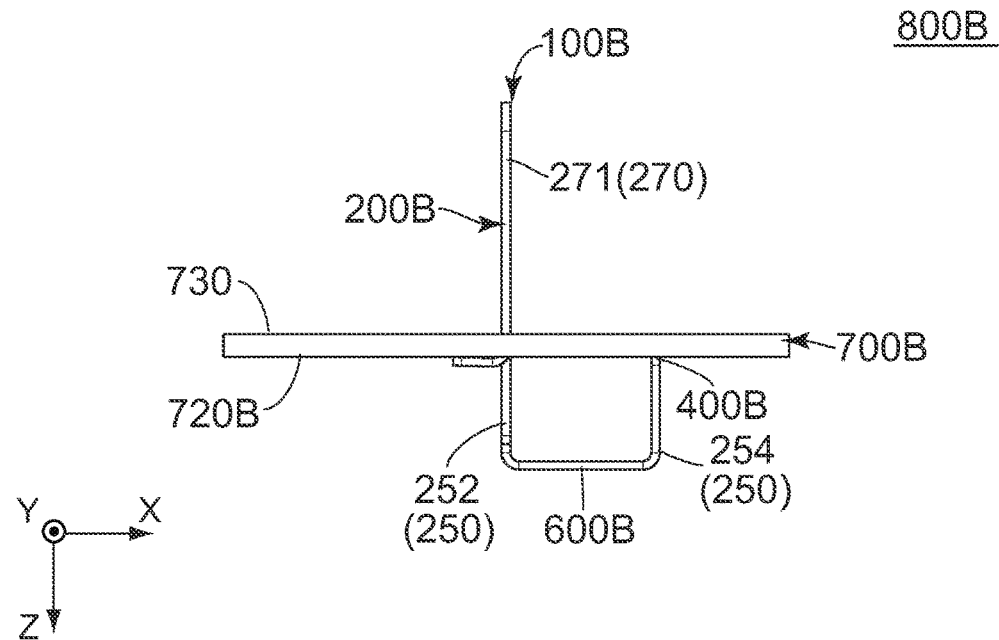
FIG. 23 is a side view showing the assembly of FIG. 17.

As shown in FIG. 24, the main portion 200B of the present embodiment has a height in the vertical direction, or in the up-down direction. As shown in FIG. 23, the main portion 200B is, at least in part, positioned below the soldering terminal 300B in the vertical direction when the soldering terminals 300B are soldered on the circuit board 700B. As shown in FIG. 17, the main portion 200B, at least in part, extends to a lower side of the circuit board 700B through the opening 710.

As described above, the antenna 100B of the present embodiment is configured so that the main portion 200B is, at least in part, positioned below the soldering terminal 300B in the vertical direction when the soldering terminals 300B are soldered on the circuit board 700B. Accordingly, the antenna 100B of the present embodiment is configured so that a part of the main portion 200B is positioned within a thickness of the circuit board 700B when the antenna 100B is attached to the circuit board 700B. In other words, a portion of the antenna 100B of the present embodiment, which protrudes outward from the circuit board 700B, has a reduced size.

As shown in FIG. 24, the main portion 200B of the present embodiment has an upper portion 250 and a lower portion 270.

Figure 21:
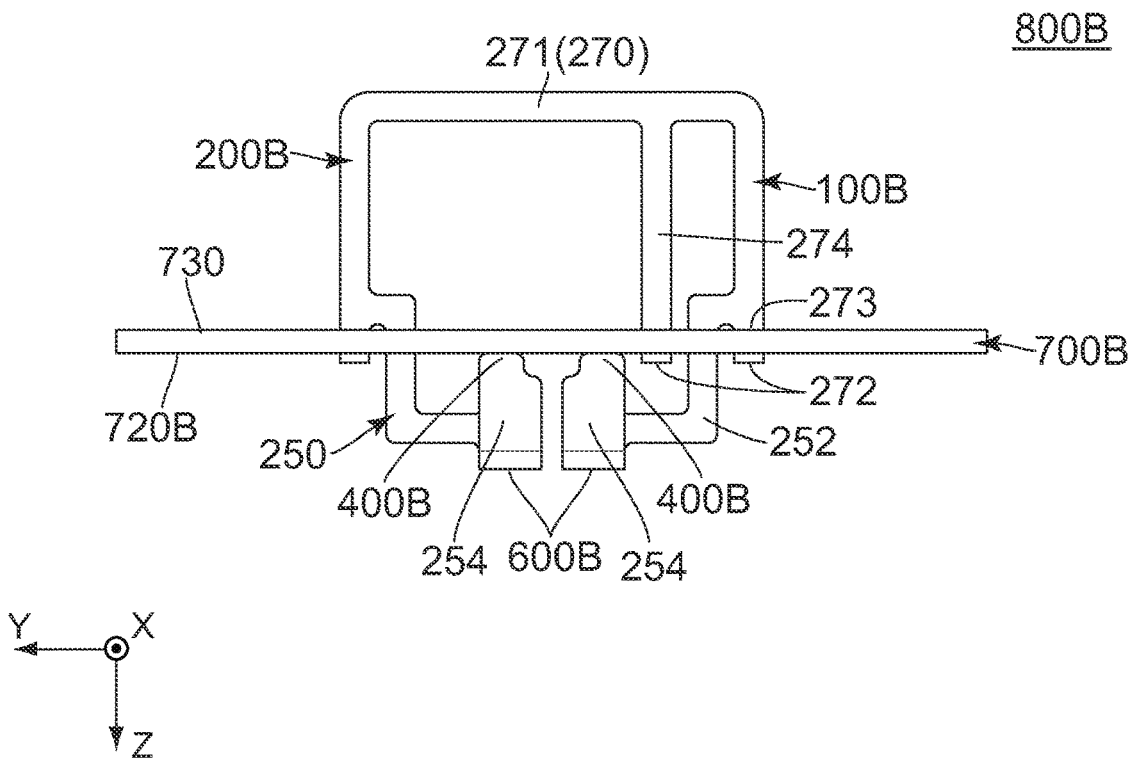
FIG. 21 is a front view showing the assembly of FIG. 17.
Figure 22:
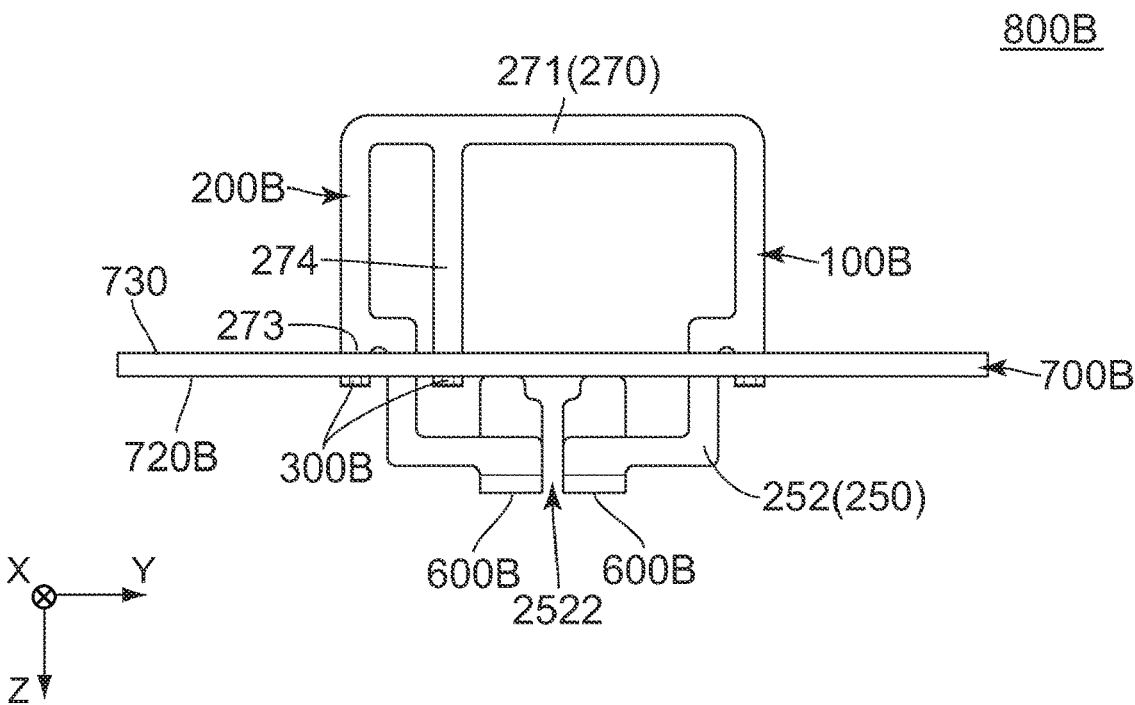
FIG. 22 is a rear view showing the assembly of FIG. 17.

As shown in FIGS. 21 and 22, the upper portion 250 of the present embodiment is positioned above the lower portion 270 in the vertical direction. The upper portion 250 has an upper frame portion 252 and two second coupling portions 254. Specifically, the upper frame portion 252 has a split 2522.

As shown in FIG. 24, the upper frame portion 252 of the present embodiment has a flat-plate shape. More specifically, the upper frame portion 252 has the flat-plate shape in a plane perpendicular to the front-rear direction. However, the present invention is not limited thereto. The upper frame portion 252 may be formed by bending a plate metal. In addition, the upper frame portion 252 may have any three-dimensional shape, such as cylindrical or rectangular forms. As shown in FIG. 22, the split 2522 is positioned at an upper end of the upper frame portion 252 in the up-down direction. The upper frame portion 252 is positioned above the upper surface 720B of the circuit board 700B in the vertical direction when the soldering terminals 300B are soldered on the circuit board 700B. The upper frame portion 252 is not positioned within the thickness of the circuit board 700B when the soldering terminals 300B are soldered on the circuit board 700B.

Referring to FIGS. 22 and 24, the two second coupling portions 254 are bent at opposite ends, respectively, of the split 2522 to extend forward therefrom, and are further bent to extend downward therefrom. The second coupling portions 254 are coupled with the fixed portions 400B, respectively. In other words, the second coupling portion 254 couples the upper frame portion 252 and the fixed portion 400B with each other. A center of gravity of the antenna 1008 is positioned below the second coupling portion 254 in the vertical direction. As shown in FIG. 18, each of the second coupling portions 254 is positioned above the upper surface 720B of the circuit board 700B in the vertical direction when the soldering terminals 300B are soldered on the circuit board 700B. None of the second coupling portions 254 are positioned within the thickness of the circuit board 700B when the soldering terminals 300B are soldered on the circuit board 700B.

As shown in FIG. 24, the lower portion 270 of the present embodiment is positioned below the upper portion 250 in the vertical direction. The lower portion 270 has a flat-plate shape. However, the present invention is not limited thereto. The lower portion 270 may be formed by bending a plate metal. In addition, the lower portion 270 may have any three-dimensional shape, such as cylindrical or rectangular forms. The lower portion 270 has a lower frame portion 271 and two first coupling portions 273, 274.

As shown in FIG. 22, the lower frame portion 271 of the present embodiment defines a lower end of the main portion 200B. In addition, the lower frame portion 271 defines opposite ends of main portion 200B in the right-left direction. The lower frame portion 271 is coupled with the upper frame portion 252. A part of the lower frame portion 271 is positioned within the thickness of the circuit board 700B when the soldering terminals 300B are soldered on the circuit board 700B.

As shown in FIG. 24, the first coupling portion 273 of the present embodiment is positioned at a left end of the lower frame portion 271 in the right-left direction. The first coupling portion 273 extends in the vertical direction from the lower frame portion 271. Specifically, the first coupling portion 273 extends upward in the up-down direction from the lower frame portion 271. An upper end of the first coupling portion 273 is an upper end 272 of the lower portion 270 in the vertical direction. The first coupling portion 273 couples the lower frame portion 271 and one of the soldering terminals 300B with each other. The center of gravity of the antenna 1008 is positioned below the first coupling portion 273 in the vertical direction. As shown in FIG. 18, a part of the first coupling portion 273 is positioned within the thickness of the circuit board 700B when the soldering terminals 300B are soldered on the circuit board 700B.

As shown in FIG. 21, the first coupling portion 274 of the present embodiment extends upward in the up-down direction from a lower end of the lower frame portion 271. An upper end of the first coupling portion 274 is the upper end 272 of the lower portion 270 in the vertical direction. The first coupling portion 274 couples the lower frame portion 271 and a remaining one of the soldering terminals 300B with each other. Referring to FIGS. 21 and 24, a part of the first coupling portion 274 is positioned above the upper surface 720B of the circuit board 700B in the up-down direction when the soldering terminals 300B are soldered on the circuit board 700B. Another part of the first coupling portion 274 is positioned within the thickness of the circuit board 700B when the soldering terminals 300B are soldered on the circuit board 700B. In other words, the latter part of the first coupling portion 274 is positioned within the opening 710 of the circuit board 700B when the soldering terminals 300B are soldered on the circuit board 700B.

As shown in FIG. 18, the soldering terminal 300B of the present embodiment extends from the main portion 200B along the horizontal plane perpendicular to the vertical direction. In other words, each of the soldering terminals 300B extends from the main portion 200B along the horizontal plane parallel to the circuit board 700B. The one of the soldering terminals 300B extends from the first coupling portion 273 of the main portion 200B along the horizontal plane perpendicular to the vertical direction, and the remaining one of the soldering terminals 300B extends from the first coupling portion 274 of the main portion 200B along the horizontal plane. More specifically, the one of the soldering terminals 300B extends outward in the front-rear direction from the first coupling portion 273 of the main portion 200B, and the remaining one of the soldering terminals 300B extends outward in the front-rear direction from the first coupling portion 274 of the main portion 200B. As shown in FIG. 24, the soldering terminal 300B extends from the upper end 272 of the lower portion 270. Referring to FIG. 23, the center of gravity of the antenna 1008 is positioned below the soldering terminal 300B in the vertical direction.

Figure 20:
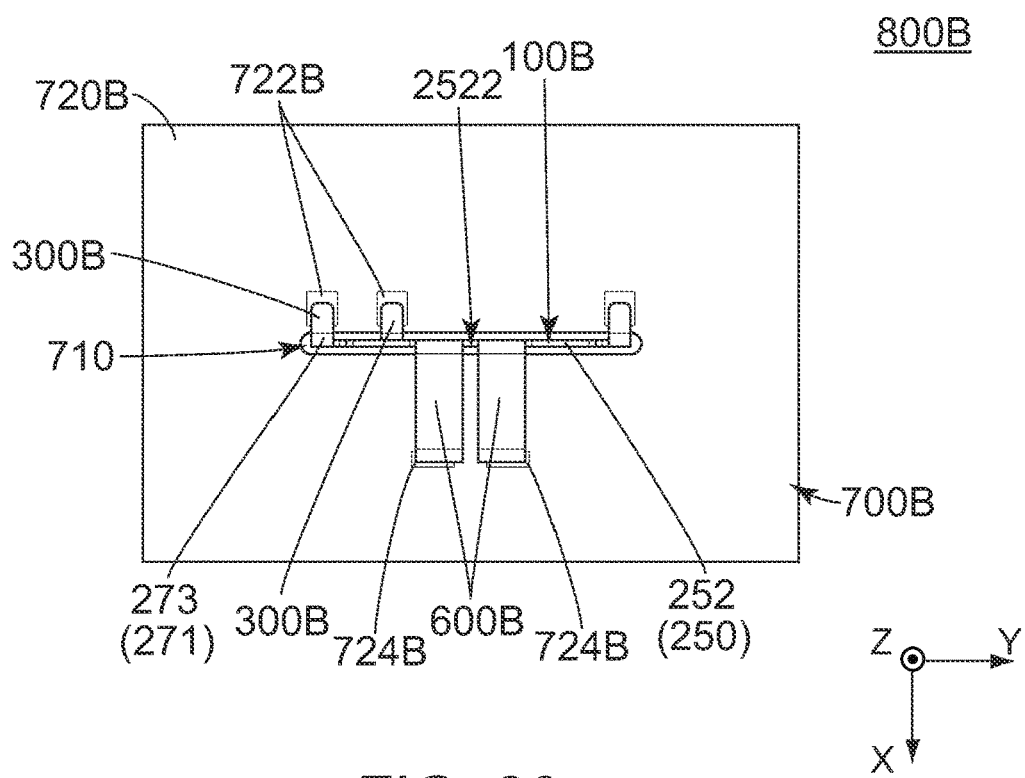
FIG. 20 is a top view showing the assembly of FIG. 17.

As shown in FIG. 18, the soldering terminal 300B is fixed on the upper surface 720B of the circuit board 700B. When the antenna 1008 is attached to the circuit board 700B, each of the soldering terminals 300B is fixed on the circuit board 700B at a location different from any of locations of the fixed portions 400B. More specifically, referring to FIGS. 18 and 20, when the antenna 1008 is attached to the circuit board 700B, each of the soldering terminals 300B is fixed on the circuit board 700B at the location which is positioned leftward in the right-left direction beyond any of the fixed portions 400B. In other words, under the attached state of the antenna 1008 on the circuit board 700B, each of the soldering terminals 300B is fixed on the circuit board 700B at the location which is positioned leftward of the leftmost or left fixed portion 400B in the right-left direction. The soldering terminal 300B is fixed on the circuit board 700B by soldering. More specifically, the soldering terminal 300B is fixed on the pad 722B by soldering.

As shown in FIG. 18, each of the soldering terminals 300B is positioned above the upper surface 720B of the circuit board 700B in the up-down direction when the antenna 1008 is attached to the circuit board 700B. In other words, none of the soldering terminals 300B are positioned within the thickness of the circuit board 700B when the antenna 1008 is attached to the circuit board 700B.

As shown in FIG. 18, the fixed portions 400B of the present embodiment extend from the second coupling portions 254, respectively. The fixed portions 400B extend in the vertical direction from the second coupling portions 254, respectively. The fixed portion 400B extends downward in the up-down direction from the second coupling portion 254. Referring to FIG. 23, the center of gravity of the antenna 1008 is positioned below the fixed portion 400B in the vertical direction.

As shown in FIG. 18, each of the fixed portions 400B of the present embodiment is fixed on the upper surface 720B of the circuit board 700B. When the soldering terminals 300B are soldered on the circuit board 700B, each of the fixed portions 400B is fixed on the circuit board 700B at the location different from any of the locations of the soldering terminals 300B. More specifically, referring to FIGS. 18 and 20, when the soldering terminals 300B are soldered on the circuit board 700B, each of the fixed portions 400B is fixed on the circuit board 700B at the location which is positioned rightward in the right-left direction beyond any of the soldering terminals 300B. In other words, under the soldered state of the soldering terminals 300B on the circuit board 700B, each of the fixed portions 400B is fixed on the circuit board 700B at the location which is positioned rightward of the rightmost or right soldering terminal 300B in the right-left direction. The fixed portion 400B is fixed on the circuit board 700B by soldering. More specifically, the fixed portion 400B is fixed on the pad 724B of the circuit board 700B by soldering. The fixed portion 400B may or may not be electrically connected with the pad 724B.

As shown in FIG. 18, each of the fixed portions 400B is positioned above the upper surface 720B of the circuit board 700B in the up-down direction when the antenna 1008 is attached to the circuit board 700B. In other words, none of the fixed portions 400B are positioned within the thickness of the circuit board 700B when the antenna 1008 is attached to the circuit board 700B.

As shown in FIG. 24, the antenna 1008 of the present embodiment further comprises suction portions 600B.

As shown in FIG. 24, each of the suction portions 600B of the present embodiment is a part of the second coupling portion 254. The suction portion 600B has a plane perpendicular to the vertical direction. As shown in FIG. 18, the suction portion 600B is positioned above the soldering terminal 300B in the vertical direction. The suction portion 600B defines an upper end of the antenna 1008.

As shown in FIG. 21, each of the suction portions 600B is positioned above the upper surface 720B of the circuit board 700B in the up-down direction when the antenna 1008 is attached to the circuit board 700B. In other words, none of the suction portions 600B are positioned within the thickness of the circuit board 700B when the antenna 1008 is attached to the circuit board 700B.

Since the antenna 100B of the present embodiment has the aforementioned suction portions 600B, the whole of the antenna 1008 can be lifted up by picking the suction portions 600B up by the use of vacuum chucks. Thus, the antenna 1008 of the present embodiment is easily handled in an automatic component feeder system.

Although the specific explanation about the present invention is made above referring to the embodiments, the present invention is not limited thereto and is susceptible to various modifications and alternative forms. In addition, the above embodiments and variations may also be combined.

While there has been described what is believed to be the preferred embodiment of the invention, those skilled in the art will recognize that other and further modifications may be made thereto without departing from the spirit of the invention, and it is intended to claim all such embodiments that fall within the true scope of the invention.

What is claimed is:

1. An antenna which is configured to be soldered on a circuit board having a lower surface and an upper surface positioned above the lower surface in a vertical direction, wherein:
the antenna comprises a main portion, at least one soldering terminal, and at least one fixed portion;
the main portion has a height in the vertical direction;
the main portion is, at least in part, positioned below the soldering terminal in the vertical direction when the soldering terminal is soldered on the circuit board;
the soldering terminal extends from the main portion along a horizontal plane perpendicular to the vertical direction; and
when the soldering terminal is soldered on the upper surface of the circuit board, the fixed portion is fixed on the upper surface of the circuit board at a location different from a location of the soldering terminal.

2. The antenna as recited in claim 1, wherein the fixed portion is configured to be fixed on the circuit board by soldering.

3. The antenna as recited in claim 2, wherein the fixed portion extends from the main portion along the horizontal plane.

4. The antenna as recited in claim 1, wherein:
the main portion has an upper end in the vertical direction; and
each of the soldering terminal and the fixed portion extends from the upper end of the main portion.

5. The antenna as recited in claim 1, wherein:
the antenna has a suction portion; and
in the vertical direction, the suction portion is positioned at a position same as a position of the soldering terminal or is positioned above the soldering terminal.

6. The antenna as recited in claim 5, wherein:
the at least one soldering terminal includes two of the soldering terminals;
the at least one fixed portion includes two of the fixed portions;
the antenna comprises two mounting sets;
each of the mounting sets is composed of the soldering terminal and the fixed portion; and
the suction portion is positioned between the two mounting sets.

7. The antenna as recited in claim 1, wherein:
the main portion has an upper portion and a lower portion;
the lower portion is positioned below the upper portion in the vertical direction;
the lower portion has an upper end in the vertical direction; and
the soldering terminal extends from the upper end of the lower portion.

8. The antenna as recited in claim 7, wherein the lower portion has a plate-like shape.

9. The antenna as recited in claim 7, wherein:
the antenna further comprises a suction portion; and
the suction portion is positioned above the soldering terminal in the vertical direction.

10. The antenna as recited in claim 1, wherein a center of gravity of the antenna is positioned below the soldering terminal in the vertical direction.

11. An assembly comprising a circuit board and an antenna, the circuit board being formed with an opening, and the antenna being attached to the circuit board, wherein:
the circuit board has an upper surface in a vertical direction;
the upper surface of the circuit board is formed with at least one pad;
the antenna comprises a main portion, at least one soldering terminal, and at least one fixed portion;
the main portion, at least in part, extends to a lower side of the circuit board through the opening;
the soldering terminal extends from the main portion along a horizontal plane parallel to the circuit board;
the soldering terminal is soldered on the pad; and the fixed portion is fixed on the upper surface of the circuit board.

\* \* \* \* \*